United States Patent [19]

Waggoner

[11] Patent Number: 4,514,586

[45] Date of Patent: Apr. 30, 1985

[54] METHOD OF USING A SHIELDING MEANS TO ATTENUATE ELECTROMAGNETIC RADIATION IN THE RADIO FREQUENCY RANGE

[75] Inventor: John Waggoner, Ft. Wayne, Ind.

[73] Assignee: Enthone, Inc., New Haven, Conn.

[21] Appl. No.: 635,125

[22] Filed: Jul. 27, 1984

Related U.S. Application Data

[63] Continuation of Ser. No. 412,916, Aug. 30, 1982, abandoned.

[51] Int. Cl.³ .............................................. H05K 9/00
[52] U.S. Cl. .............................. 174/35 MS; 428/621; 428/936; 428/671; 428/675; 428/672; 427/264; 174/35 R
[58] Field of Search ............... 428/936, 621, 671, 672, 428/675; 427/264; 174/35 MS, 35 R

[56] References Cited

U.S. PATENT DOCUMENTS

| | | | |
|---|---|---|---|
| 3,136,676 | 6/1964 | Fisch | 174/35 MS |
| 3,247,574 | 4/1966 | Wirtz | 174/35 MS |
| 3,328,509 | 6/1967 | Schulz | 174/35 MS |
| 3,332,860 | 7/1967 | Diebold et al. | 174/35 MS |
| 3,517,109 | 6/1970 | Paine | 174/35 MS |
| 4,169,171 | 9/1979 | Narcus | 428/936 |

Primary Examiner—Veronica O'Keefe
Attorney, Agent, or Firm—DeLio & Associates

[57] ABSTRACT

Shielding means comprising a non-conductive base material having thereon a combined electrolessly-deposited metal layer of copper over lain with a second layer.

4 Claims, No Drawings

METHOD OF USING A SHIELDING MEANS TO ATTENUATE ELECTROMAGNETIC RADIATION IN THE RADIO FREQUENCY RANGE

This is a continuation of co-pending application Ser. No. 412,916 filed on 8/30/82, now abandoned.

BACKGROUND OF THE INVENTION

The present invention relates to electromagnetic radiation shielding and more particularly to a shielding means comprising a non-conductive base material having thereon a combined electrolessly-deposited metal layer of copper over lain with a second layer.

It is often necessary to provide shielding material or enclosures for electronic and radio equipment which shields against electromagnetic radiation such as radio-frequency interference emitted from electronic and radio equipment therein. Regulations of the Federal Communication Commission require that certain categories of electronic and computer equipment be enclosed by radio-frequency interference shields. Electronic radio frequency radiation ranges from about 10 kiloHerz to 1,000 megHerz. Generally, shielding devices shield against a much wider frequency band of electromagnetic radiation.

It is known that electrically conducting materials will effectuate electromagnetic radiation shielding in general and radio-frequency interference shielding in particular. Accordingly it is common practice to provide a metal coating on enclosures for electronic equipment. Among the techniques known to apply a metal coating, are the use of electrically conductive paints, flame or arc spray metal techniques, cathode sputtering techniques, vacuum metallization, the application of metal foils, the electroless deposition of a metal layer, etc.

U.S. Pat. No. 4,169,171, issued Sep. 25, 1979 to Harold Narcus and assigned to the assignee of this application, discloses the use of an electroless metal coating over dielectric material such as ABS plastic or other materials, with the use of an electroless copper coating followed by a secondary electroless metal coating. The disclosure of U.S. Pat. No. 4,169,171 is directed to providing a finished product for a decorative use only, i.e., a bright metal outer surface.

Copper is known to be an economical and effective radio-frequency shielding metal, but has the disadvantage of darkening and surface oxidizing so that it is, per se, unsuitable for use as an effective metal shield. Pure copper shielding also oxidizes, and loses electrical conductivity at the mating surfaces of the enclosure. The oxidized copper surfaces become insulators and therefore act as slot antennas, leaking radio-frequency radiation, therefrom.

Generally, the effectiveness of electromagnetic radiation shielding i.e., radio-frequency interference shielding, is measured in decibels and generally, a 10 decibel attenuation corresponds to a signal reduction to about 90.9% of the unshielded signal; a 20 decibel attenuation is equivalent to a 99.0% reduction of the original signal and a 30 decibel attenuation is comparable to a 99.9% attenuation of the original signal, and so on.

SUMMARY OF THE INVENTION

In accordance with the present invention, there is provided an electromagnetic radiation shielding means which comprises:

an electrically non-conductive base material;

an electrolessly deposited copper layer thereon, the copper layer being of a thickness to render electrically conductive the thus coated base material. The copper is electrolessly deposited so as to provide a uniform thickness of copper, which is also pore free;

an electrolessly deposited second layer, selected from the class consisting of nickel, cobalt, gold and alloys thereof, but preferably nickel, or nickel alloys. This second layer overlies the copper layer on the side thereof opposite the base material to provide a combined metal layer. This second layer is of a thickness at least sufficient to protect the copper layer from oxidation by ambient air. This layer is electrolessly deposited so as to provide a uniform thickness of metal, which is pore free.

When proceeding according to the instant invention the combined metal layer must be effective to provide shielding of 20 decibels or more against radio-frequency radiation over the range of 10 kiloHerz to 1000 megaHerz.

In accordance with other aspects of the invention, the copper layer ranges in thickness from 5 microinches and above. Preferably the copper layer thickness is form about 10 to 100,000 microinches. The second layer of metal over the copper must be a sufficient thickness to protect the copper layer from oxidation and its thickness ranges from 5 microinches and above. Preferably this layer ranges in thickness from about 10 to 100,000 microinches. The base material may have opposite sides with the combined metal layer being applied to one or more of the opposite sides.

Another aspect of the invention is directed to a method of making an electromagnetic radiation-shielding means which method comprises the following steps.

Treating an electrically non-conductive base material to prepare it for electroless coating.

Electrolessly depositing on the base material a copper layer of a thickness at least sufficient to render electrically conductive the base material.

Electrolessly depositing a second layer selected from the class consisting of nickel, gold, cobalt and alloys thereof, over the copper layer, to provide a combined metal layer, the second layer being of a thickness at least sufficient to protect the copper layer from oxidation by ambient air.

In the aspect of the invention, the minimum treatment of the base material to prepare it for electroless coating comprises etching the surface of the base material and depositing an electroless plating catalyst for activation of the base material surface. The copper layer is then deposited by treating the prepared base material with a primary electroless copper coating solution and then treating the resultant copper layered base material with an electroless nickel coating solution.

In one aspect of the invention, the electroless nickel coating solution contains an alloying compound selected from the group consisting of a boron compound and a phosphorus compound so as to provide one of a nickel-phosphorus alloy (preferably about 1 to about 14% by weight phosphorus) and a nickel-boron alloy (preferably about 0.5 to 6% by weight boron) as said nickel layer.

In accordance with another aspect of the invention, the electroless nickel bath contains a sufficient amount of a boron compound to provide the nickel layer as a nickel-boron alloy of about 0.5 to 6% by weight boron or a sufficient amount of phosphorous compound to provide the nickel layer as a nickel-phosphorus alloy of about 1 to 14% by weight phosphorus.

DETAILED DESCRIPTION OF THE PREFERRED EMBODIMENTS

The electrically non-conductive base material may comprise any suitable material having the requisite structural strength or other characteristics desirable or necessary for the particular use to which the enclosure of base material is to be put. Typically, there is a cabinet to receive radio or other electronic equipment. It should be made of any suitable electrically non-conductive or dielectric material such as any thermosetting or thermoplastic resin or other suitable material. Generally, any suitable synthetic organic polymeric material, i.e., "plastic", such as acrylonitrite-butadiene-styrene (ABS), other synthetic organic polymeric materials such as, without limitation, polypropylene oxide, and polycarbonate plastics, or any other suitable plastic, or reinforced plastic, or other dielectric material such as glass, ceramic, glass fiber, reinforced ceramic, pressed board or composite material known to be useful for such purpose may also be used as the base material.

Electrically non-conducting base materials having one or more metal layers thereon are utilized for radio-frequency shielding in particular, electromagnetic interference shielding in general, and electro-static discharge applications. For convenient reference in this application and in the claims, the term "electromagnetic shielding" shall be utilized to refer to the shielding of one or more or all of the foregoing types of energy.

In order to demonstrate the shielding effectiveness of compositions in accordance with the present invention, a series of plastic test panels were coated with copper, nickel, and copper-nickel combined metal layers (the latter in accordance with the present invention) and tested for the effectiveness in attenuating electromagnetic radiation in the radio-frequency range. As indicated by the table given below, the shielding effectiveness of electroless nickel is relatively low whereas that of electroless copper is more effective. However, as discussed above, the secondary or overlayer of nickel overcomes problems of corrosion attendant upon the use of a copper layer alone.

| Sample Code | Metal Layer | Thickness u in. | Resistivity | Range of dB Attenuation .05–1000 MHz Wave Length |
|---|---|---|---|---|
| A | CU | 10 | 19 mOhm | 64–111 |
| B | NI | 7 | 10,750 mOhm | 11–22 |
| C | NI | 14 | 214 mOhm | 40–75 |
| D | NI | 16 | 485 mOhm | 36–60 |
| E | CU + NI | 10 + 8 | 24 mOhm | 62–112 |
| F | CU + NI | 11 + 9 | 24 mOhm | 64–104 |
| G | CU + NI | 11 + 8 | 23 mOhm | 63–113 |
| H | NI + CU | 8 + 10 | 28 mOhm | 61–111 |
| I | None | 0 | Indefinite | 0–2 |
| J | Ag coated .125 on brass | | <1 mOhm | 149–>172 |

Generally, nickel is the preferred over layer because of its good anti-corrosion characteristics. However, both cobalt, gold and alloys of the same class be utilized in place of nickel in accordance with the invention. However, both of these metals are much more expensive than nickel and for this reason nickel is strongly preferred as the second metal layer. The deposition of the nickel protective coating is facilitated by the utilization of a nickel-boron or a nickel-phosphorus alloys as the second protective layer.

The metal coated non-conductive base materials of the invention may be prepared as follows. The non-conductive substrate such as, for example, an ABS substrate may be prepared in any conventional manner, for example, as follows (1) Etch the surface of the ABS using the conventional chromic acid-sulfuric acid aqueous solution.

(2) Rinse in water.

(3) Neutralize residual etch solution in a dilute sodium bisulfate solution.

(4) Rinse in water.

(5) Activate in a one or two-stage non-noble or noble catalyst solution.

(6) Rinse in water.

(7) Accelerate in an alkaline sodium borohydride or dilute fluoboric acid solution.

(8) Rinse in water.

After the surface preparation the piece may be immersed into an electroless copper bath and the copper layer is deposited thereon. The copper electroless coating bath comprises a solution of copper salts and one or more polar solvents, preferably water, and may include a chelating agent, an alkaline pH adjusting chemical, a reducer and a bath stabilizer.

The nickel bath contains conventional bath additives such as a chelating agent, pH adjusting chemical, a reducer and bath stabilizer.

The electroless copper bath thus may comprise a dissolved copper salt such as copper sulfate, a chelating agent present in an amount sufficient to chelate at least as much of the copper as is sought to be deposited at the desired deposition rates, one or more pH controlling chemicals, for example, an inorganic hydroxide or an amine, a stabilizer such as sodium cyanide and an active reducing agent such as formaldehyde, glyoxime or hydrazine.

The nickel plating bath employs a nickel salt such as nickel chloride, additives such as lactic and propionic acids, a stabilizer, for example lead acetate, and a reducing agent, preferably one containing phosphorus or boron, such as sodium hypophosphate.

An advantage of the present invention is that the electroless deposited combined metal layer may be applied by immersing the work pieces into tanks containing the electroless plating solutions. This is a very efficient manufacturing techinque which enables the process to be highly automated. For example, the work pieces or enclosures to be electrolessly plated in accordance with the invention may be conveyed on movable overhead racks and dipped into the appropriate electroless plating tanks and rinse tanks and the like in an assembly line-like automated process.

Other techniques such as painting, metal sputtering, metal arc spraying and the like are not ameanable to such techniques and often require labor intensive applications of the coatings.

While the invention has been described in detail with respect to preferred and specific embodiments thereof, it will be appreciated that numerous alterations and modifications thereto will occur to those skilled in the art upon a reading and understanding of the foregoing. It is intended to include all such modifications and alterations within the scope of the appended claims.

What is claimed is:

1. A method of attenuating electromagnetic radiation in the radio-frequency range comprising:

attenuating such radiation with means comprising an electrically nonconductive material forming an enclosure and having:

an inner and outer surface;

a pore free layer of copper metal of a uniform thickness electrolessly deposited on at least one surface of said enclosure, said layer of copper metal being of a thickness of at least 5 microinches and at least sufficient to render electrically conductive the thus coated surface of said enclosure; and a second layer, selected from the class consisting of nickel, cobalt, gold and alloys thereof, electrolessly deposited and overlying the copper layer, to provide a combined metal layer, the second layer being of a thickness of at least 5 microinches and at least sufficient to protect the copper layer from oxidation;

the combined metal layer providing shielding of 20 dB or more against radio-frequency radiation over the range of 10 kilohertz to 1,000 megahertz.

2. The method of claim 1 wherein the second layer of the enclosure is a nickel layer or a nickel alloy layer.

3. The method of claim 2 wherein said layer of copper metal ranges in thickness from 5 to 5,000 microinches and the second layer ranges in thickness from 5 to 5,000 microinches.

4. The method of claim 2 wherein the inner and outer surfaces of said enclosure have deposited thereon the copper layer and the second layer.

* * * * *